United States Patent [19]

Choi

[11] 4,433,368
[45] Feb. 21, 1984

[54] POWER SUPPLY CIRCUIT FOR A VARIABLE ELECTRICAL SOURCE

[75] Inventor: Hak-Ki Choi, Kyungki, Rep. of Korea

[73] Assignee: Samsung Electronics Co., Ltd., Kyungki, Rep. of Korea

[21] Appl. No.: 337,162

[22] Filed: Jan. 5, 1982

[30] Foreign Application Priority Data

Apr. 1, 1981 [KR] Rep. of Korea ............ 1981/2305[U]
Apr. 1, 1981 [KR] Rep. of Korea ............ 1981/2306[U]
Apr. 1, 1981 [KR] Rep. of Korea ............ 1981/2307[U]
Apr. 1, 1981 [KR] Rep. of Korea ............ 1981/2308[U]

[51] Int. Cl.³ .......................................... H02M 1/14
[52] U.S. Cl. ....................................... 363/45; 363/86
[58] Field of Search .................. 307/4, 149, 150, 151; 323/209, 217, 265, 266, 273, 278, 282, 300, 303; 363/44, 45, 46, 85, 86, 125, 126, 143

[56] References Cited

U.S. PATENT DOCUMENTS 3,486,104 12/1969 Epstein .................................. 363/46
3,600,663  8/1971 Wagner .................................. 363/46
3,769,573 10/1973 Scantlin ................................ 323/266

FOREIGN PATENT DOCUMENTS 1588075 12/1970 Fed. Rep. of Germany ........ 363/86

Primary Examiner—William M. Shoop
Attorney, Agent, or Firm—Brumbaugh, Graves, Donohue & Raymond

[57] ABSTRACT

A novel converter circuit converts AC input voltage within the range of 85–260 VAC to a constant voltage, current limited DC output voltage wth substantially no input voltage, all without the use of a transformer or input voltage-select switch. The AC input voltage is inputted directly to a rectifier and then to the input of a phase-controlling element (SCR) for controlling the phase of the unfiltered rectified signal. A trigger signal-generating circuit generates a trigger signal for regulating the operation of the phase-controlling element. A ripple-removing filter circuit receives the output from the phase-controlling element and removes the ripple component. A voltage-regulating circuit, a current-limiting circuit, and a rapid start-up circuit to facilitate rapid generation of DC output signal soon after energization of the overall circuit by an AC power source are also disclosed.

3 Claims, 7 Drawing Figures

POWER SUPPLY CIRCUIT FOR A VARIABLE ELECTRICAL SOURCE

TECHNICAL FIELD OF THE INVENTION

The present invention relates to a power supply circuit for converting AC to DC, and more particularly to a circuit for obtaining a low voltage, stable DC signal from a non-switched successive and variable alternating current electrical source, having a broad range from 85 to 260 V, without use of a step-down transformer or tap-switch, so that circuits of electronic appliances can be protected.

BACKGROUND OF THE INVENTION

As is commonly known, the available AC input voltage varies from area to area. Presently, the usual AC electrical source used in Korea and Japan is 100 V and/or 220 V. In some countries, including Australia, 250 V of AC power is used, and AC power from 100 V–250 V is usually used worldwide. (Table I below lists by country the type of available AC power.)

Therefore, when electronic appliances are exported to other countries where the AC electrical source has a different voltage, a power supply using a transformer having a fixed voltage specification, depending on the area where it is going to be exported, is usually necessary.

This variation in AC power from country to country causes inconvenience in making electronic appliances and thereby results in both increase of production costs and other additional problems.

A conventional power supply is illustrated in FIG. 1, wherein a tap-switch SW2 is switched to one of two positions as determined by the input voltage of the available alternating current (for instance, 100 V, 220 V) which is to be inputted into input terminals 1a and 1b. At the output side of the step-down transformer T, a predetermined AC output voltage is obtained when the switch SW1 is closed. This output voltage is rectified by a resistor Ra and a rectifier bridge Rf and then is partially smoothed by a capacitor Ca. This partially smoothed DC voltage is further filtered by an active filter circuit comprising transistors Qa, Qb and Qc, for the purpose of removing ripple caused by the frequency of AC voltage.

However, in the conventional circuit mentioned above, a step-down transformer and a tap-switch (for setting of either 100 V or 220 V) is necessary. The conventional circuit is usually included inside an electrical appliance (for example, TV, audio set, video set, etc.) in case of a variation of AC input voltage depending on the area where the appliance is used. Frequently, in order to set the tap-switch, the appliance cabinet must be disassembled. If it is not properly set, troubles in electronic appliances may occur. Also, this design may cause difficulties in handling, as well as increasing the cost of production and the weight of the appliance. Further, because some electrical power is lost in the transformer T, its efficiency is very low. Efficiency of DC output compared to AC input is about 70 percent and the remaining 30 percent appears as a loss of electrical power in the circuit.

SUMMARY OF THE INVENTION

Accordingly, in order to overcome the disadvantages and problems as mentioned above in the conventional systems, a purpose of the present invention is to provide a power supply circuit capable of use with variable voltage AC power sources without switching. The power supply includes a rectifying circuit connected to directly receive an AC electrical source of anywhere from 85 V AC to 260 V AC of alternating current, an SCR for controlling the output phase of the rectifying circuit, a circuit for generating a trigger signal for controlling phase for triggering the SCR and an active ripple filter circuit for removing the ripple from the DC voltage signal generated by the operation of the phase controlling SCR. Accordingly, the voltage of the inputted AC electrical source is non-switched, i.e. direct, and no adjustment need be made for a specified input voltage. The inputted AC source can be within the broad range of 85 V to 260 V, and a DC output signal having substantially no ripple component can be obtained.

Numerous other advantages and features of the present invention will become readily apparent from the following detailed description of the invention and of several embodiments thereof, from the claims and from the accompanying drawings.

DETAILED DESCRIPTION OF THE PREFERRED EMBODIMENTS

Figure 1:
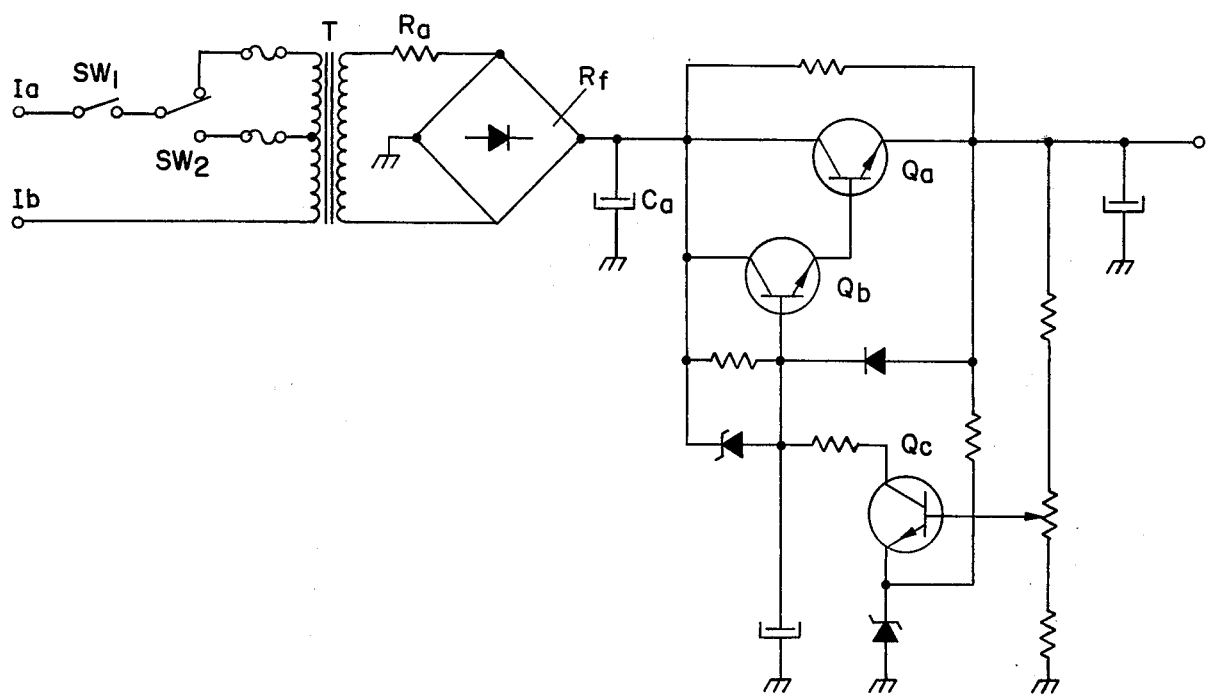
FIG. 1 is an electrical schematic of a circuit for an electrical source using a conventional step-down transformer and voltage select switch.

While this invention is susceptible of many embodiments, there is shown in the drawings and will herein be described in detail one specific embodiment, and variations thereof, with the understanding that the present disclosure is to be considered as an exemplification of the principles of the invention and is not intended to limit the invention to the embodiments illustrated.

The present invention will now be explained in detail with reference to the accompanying drawings.

Figure 2:
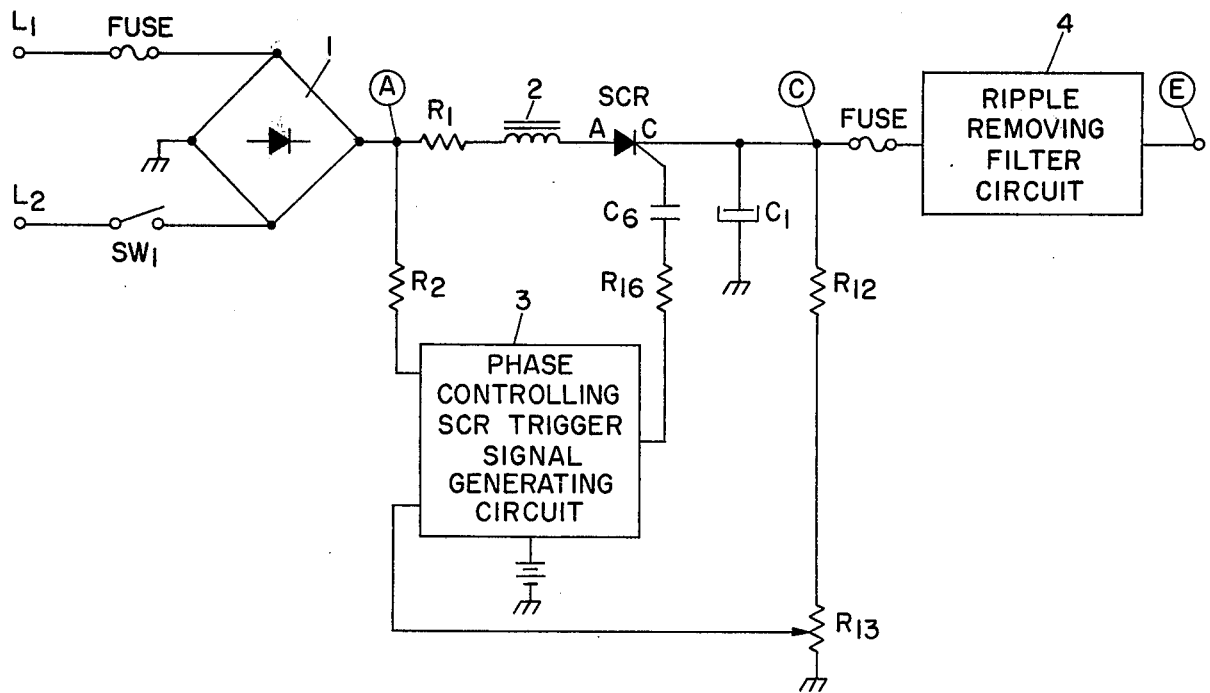
FIG. 2 is a block and schematic diagram showing an embodiment to the present invention.

FIG. 2 shows a schematic diagram of an embodiment according to the present invention. Input terminals L1 and L2 receive an AC voltage supply and pass this AC signal through SW1 (when closed) and the fuse to rectifying bridge circuit 1. The anode of rectifying circuit 1 is connected to an SCR (for controlling the phase) through R1 and choke coil 2 which extends the operating time of the SCR. The resistor R2 is connected to the trigger signal generating circuit 3 which triggers the SCR for controlling the phase in order to control each cycle of the AC input signal. The cathode terminal of the SCR is connected with the capacitor C1. The SCR charging signal is fed back to the trigger signal generating circuit 3 according to the charge of the capacitor C1, and is also connected to the input of the ripple-removing filter circuit 4. The output signal of the direct current shows substantially no ripple at point E (FIG. 7).

FIG. 7A shows the waveform at point A which is the output from bridge rectifying circuit 1. The trigger signal generating circuit 3, shown in greater detail in FIG. 3, receives this pulsating wave, which has a constant low level voltage because of resistor R2, capacitor C2, and reference voltage (Zener) diode D1.

The pulse voltage at point A is divided by a voltage divider comprising resistors R3 and R4, and then is supplied to transistor Q1 through capacitor C3 and diode D10. At the collector of transistor Q1 (point D) appears substantially the same wave voltage as that shown in FIG. 7A, because of the time constant of resistor R5 and capacitor C3. This voltage wave is transmitted to the base of transistor Q2 through resistor R8 and an integrating circuit, consisting of resistors R6, R7 and capacitor C4, and allows transistor Q2 to conduct. When conducting, the potential of the transistor Q2 at its emitter is about 0.7 V higher than the potential of its base. Resistor R9 is connected to the emitter of transistor Q2, whereas resistor R8 is connected to the base. The potential of the emitter of transistor Q2 is controlled by energizing transistor Q4 through resistor R10. Transistor Q4 is activated upon a detection of error by the potential of the base through the feedback circuit, when a DC voltage signal containing ripple appears at capacitor C1 connected to the cathode terminal of the SCR. For example, when the DC voltage at point C, (as shown in FIG. 7C) through capacitor C1 is higher than a predetermined value, the base potential of transistor Q4 is energized so that electrical current flows through the collector and through resistor R10. At this time, the potential of the emitter of transistor Q2 is lowered, transistors Q2 and Q3 no longer conduct and a voltage potential change occurs across resistor R14.

Figure 7:
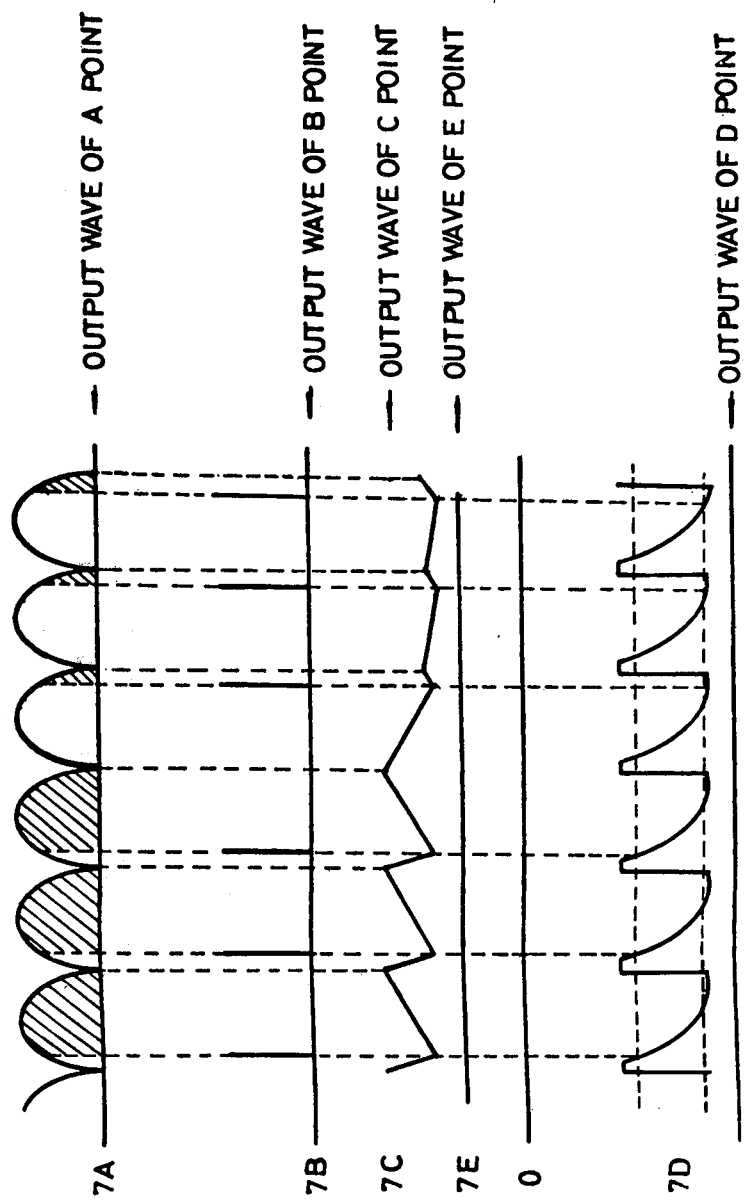
FIG. 7 is a diagram of certain voltage waveforms at certain points of the circuit of FIG. 7.

The low positioning voltage as shown as 7A in FIG. 7 is applied to the base of transistor Q2, to regulate conduction of transistor Q2, which in turn regulates conduction of transistor Q3. The conduction of transistor Q5 is regulated by the voltage drop across the resistor R14, at the time the delayed voltage shown in the wave form of 7A in FIG. 7 is applied. The lowered voltage is therefore charged in capacitor C1.

FIG. 7C shows the potential across capacitor C1. The potential of the SCR cathode terminal is decreased to zero because the potential of the SCR anode terminal is decreased to zero, as shown in FIG. 7A.

The choke coil 2 functions to extend the energizing time of the SCR and prevents unwanted radiation from being generated when the switch is operated.

When the potential at point C is decreased to less than a predetermined value, the base voltage of transistor Q4 is decreased to less than the bias voltage, and then transistor Q4 is turned off. The potential at the emitter of transistor Q2, and the bias potential is transmitted to the base of transistor Q3 through resistor R17. The voltage across resistor R14 is differentiated by capacitor C5 and diode D2. An impulse current is generated at the collector of transistor Q5 to trigger the SCR through capacitor C5 and resistor R16, as shown in FIG. 7B. The SCR is energized to increase the charge in the capacitor C1.

As described above, when the charge stored in the capacitor C1 is more than a predetermined value, the transistor Q4 is activated through a feedback circuit comprising resistors R11, R12 and R13, and the Q4 emitter potential is lowered. Therefore the operating phase of the SCR is delayed, and the low voltage is charged in the capacitor C1. When the charge stored in the capacitor C1 is decreased to less than a predetermined value, the transistor Q4 is turned off, the transistors Q2 and Q3 are rendered conductive, and the SCR is turned on by generating a trigger signal with transistor Q5, and a high voltage is charged in capacitor C1 because of the fast operating phase of the SCR. The SCR is turned off when the wave at point A as shown in FIG. 7A is decreased to zero. This operation is repeated for each cycle, so that the wave voltage as shown in FIG. 7C appears at point C across the capacitor C1.

Since the voltage across the capacitor C1 contains ripple, a ripple-removing filter circuit 4 for the purpose of removing the ripple from the signal is provided, consisting of an active ripple filter circuit and an overcurrent limiting circuit.

Figure 3:
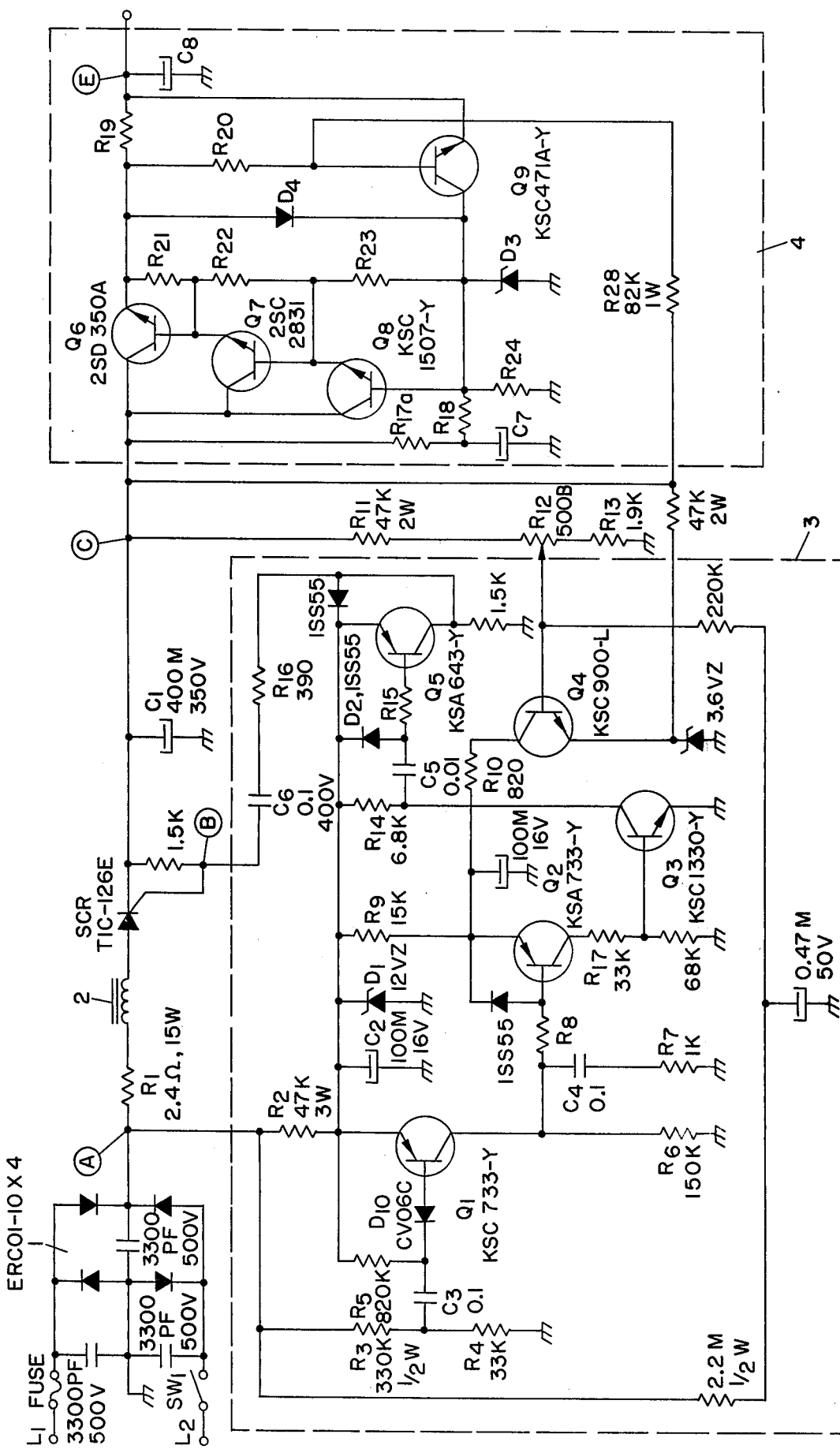
FIG. 3 is an electrical schematic showing in more detail the FIG. 2 embodiment of the invention.

FIG. 3 shows one of the examples of a ripple removing filter circuit 4 which filters the signal as shown in FIG. 7C to obtain a direct current signal (FIG. 7E) which contains less than a 0.05 percent ripple component across capacitor C8.

After the voltage across capacitor C1 decreases to a certain level (after a certain time period as determined by a time constant dependent on the multiplied values of resistor R17a and capacitor C7), it is transmitted through resistor R18 to activate transistors Q6, Q7 and Q8 (arranged in a Darlington configuration) and is maintained at a constant voltage level by reference voltage (Zener) diode D3. Resistor R19 is connected to the emitter of transistor Q9 and resistor R20 is connected to the base of transistor Q9 to act as bias resistor for transistor Q9. When the current at the emitter of transistor Q6 through resistor R20 is more than a predetermined value, a voltage transmitted to the base of transistor Q9 through resistor R20 turns on transistor Q9. Thus, the base current of transistor Q6 is shunted to limit current and the output voltage corresponds to the charge voltage of the capacitor C1, so that a constant level DC voltage of direct current with a constant level as shown in FIG. 7E can be obtained at the positive terminal of capacitor C8. Resistors R21, R22, R23 and R24 are bridge resistors and diode D4 serves to protect transistors Q6, Q7 and Q8.

The ripple-removing filter circuit 4 as shown in FIG. 3 requires a certain time (as determined by multiplied value of resistor R17a with capacitor C7) from the time that an electrical source is inputted to the time of a predetermined normal activation of the ripple-removing circuit. It has been experienced that electronic appliances are difficult to activate rapidly because of the relatively long time constant of the resistor R17a and capacitor C7, whose values are chosen in order to obtain an output signal at capacitor C8 (i.e., output as shown in FIG. 7E), which has minimum ripple.

Figure 5:
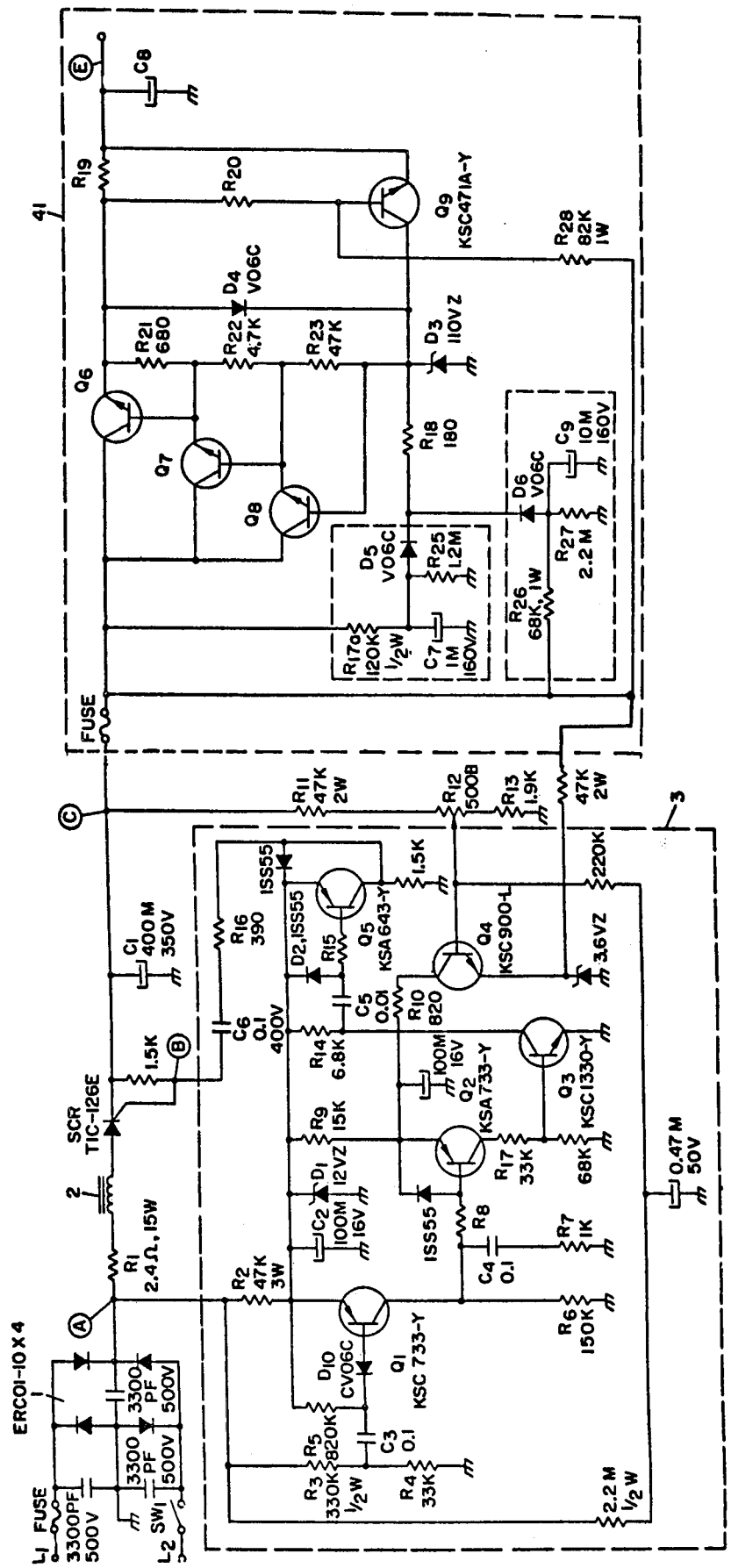
FIG. 5 is an electrical schematic of an active filter circuit according to the present invention.

Accordingly, FIG. 5 shows a second example of a ripple-removing filter circuit 41 which, compared to the ripple-removing filter circuit 4 of FIG. 3, is improved so that electrical appliances can be activated and energized in a shorter time. The ripple-removing filter circuit 41 of FIG. 5 comprises the same resistors (R17a, R18, R19, R20, R21, R22 and R23), transistors (Q6, Q7, Q8 and Q9), capacitors (C7 and C8), and diodes (D3 and D4) as in the first example shown in FIG. 3. In addition, the circuit of FIG. 5 also comprises diode D5 and resistor R18 to the base of transistor Q8. Also, diode D4 is connected between the diode D3 and the resistor R19, and resistors R26 and R27, along with capacitor C9, are connected to the anode side of diode D6.

The output from the ripple-removing filter circuit 4 of FIG. 3 is retarded, relative to the input, by a time period which is related to the time constant of the circuit comprising resistor R17a and capacitor C7. However, in circuit 41 of FIG. 5, the anode potential of diode D6 is established to reach a normal operating value in a shorter time than the anode potential of diode D5. In an initial overcurrent condition, voltage through resistor R26, capacitor C9 and diode D6 is transmitted to the base of transistor Q8. After the lapse of a certain time period (as determined by time constant of circuit comprising resistor 17 and capacitor C7, the anode potential of diode D5 has a slightly higher voltage value than the anode potential of diode D6 so that diode D6 is turned off, not to be activated, and voltage through diode D5 is transmitted to the base of transistor Q8 to conduct transistors Q6, Q7 and Q8. Therefore, by changing the time constant of the circuit an electronic appliance connected to the output at point E can be more rapidly activated by greatly shortening the start-up period (as compared to the above arrangements of FIG. 3 with activation solely through resistors R17 and R25, capacitor C7 and diode D5), and also in an advantageous manner to minimize ripple content.

Figure 6:
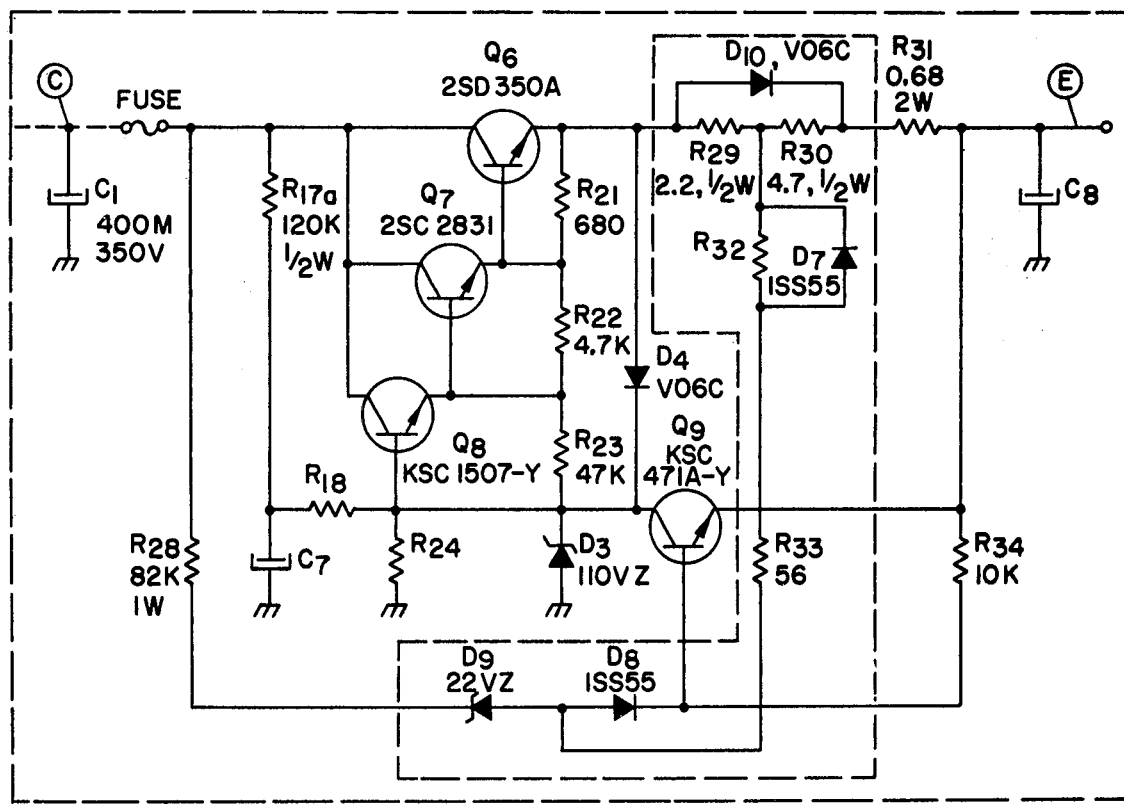
FIG. 6 is an electrical schematic of an active filter circuit according to the present invention.

FIG. 6 shows a third example of ripple-removing circuit which comprises a filter circuit 42 having an overcurrent limiting circuit. With the circuit of FIG. 6, the ripple-removing filter circuit 42 is increased to 220 $\sqrt{2}$ V in overvoltage just after the initial input of an electrical source when a phase controlling SCR or its trigger signal generating circuit 3 is not normally activated. The capacitor C1 is charged up to the peak value in response to an inputted electrical source of alternating current, for example, when it is activated with 220 V of alternating current, but the DC output at point E is established at a relatively low voltage value relative to the high voltage between the collector and emitter of transistor Q6. The allowable value of current in the collector is preferably limited, and at this time a high value of voltage to charge capacitor C1 can result in problems because it takes a long time to discharge the capacitor through the high resistance which includes resistors R17a and R18.

In order to shorten the capacitor discharge time, a higher value of limiting current in the emitter in transistor Q6 is obtained. However, a relatively precise and appropriate value of limiting current is preferably established in view of stable activation of transistor Q6. In this example (of FIG. 6) resistors R17, R18, R19, R20, R21, R22, R23, R24, transistors Q6, Q7, Q8, Q9, capacitors C7, C8, and diode D3 are similar to those described in the first and second examples.

FIG. 6 shows a third example of a ripple-removing filter circuit 42 in which resistor R19 of the second example is replaced by resistors R29, R30 and R31, which are connected in series between the emitter of transistor Q6 and capacitor C8. The voltage at the junction of resistors R29 and R30 is inputted to the base of transistor Q9 through diode D7 (and resistor R31 in parallel therewith), resistor R33 and diode D8. Resistor R28, through reference (Zener) diode D9, is connected to the anode of diode D8.

This arrangement of the ripple-removing filter circuit 42 limits initial overcurrent. In this arrangement, a current-limiting circuit consisting of resistor R28, R29 and R32, and transistor Q9 is activated so as to limit the current under operating conditions which satisfy the following equation. The voltage values of course depend upon the input voltage.

$$E_1 + E_2 = 0.6\ V (V\ \text{of transistor Q9}) \tag{1}$$

where $E_1$ represents the voltage drop across resistor R29 and where $E_2$ represents the voltage drop across resistor R32.

Transistor Q9 is preferably a silicon transistor. Where the potential of point C and point E is at its normal operation level, current limiting starts under the following conditions:
$E_1 = 0.6$ V
$E_2 = 0$ V.
If the potential of point C has markedly increased, current limiting starts under the following conditions:
$E_1 = 0$ V
$E_2 = 0.6$ V.

The voltage drop across resistor R29, i.e. $E_1$, is generated by charged value of electrical current. When $E_1$ is about 0 V, it is very difficult to obtain a precise value of limiting current, because a transistor Q6 having stable operation over a large range is necessary. Since the potential at point C contains much ripple and affects the direct current output through resistor R28, the resistors R30 and R31 are connected in series with resistor R29, and limit current under conditions satisfying the following equation (2), whatever the conditions of input voltage are.

$$E_1 + E_2 + E_3 + E_4 = 1.2\ V = (V\ \text{of transistor Q9} + V\ \text{of diode D8}) \tag{2}$$

Wherein $E_1$ represents the voltage drop across resistor R31, $E_2$ represents the voltage drop across resistor R30, $E_3$ represents the voltage across diode D8, $E_4$ represents the voltage drop across resistor R33, and $E_5$ represents the voltage drop across resistor R29. If the potential at point C and point E are at their normal level of operation, current limiting starts under the following conditions according to equation (2):
$E_1 = 0.6$ V,
$E_2 = 0.6$ V,
$E_3 = 0$ V,
$E_4 = 0$ V.
If the potential at point C is markedly increased, each resistance value is established to start current limiting under the following conditions:
$E_1 = 0$ V,
$E_2 = 0$ V,
$E_3 = 0.6$ V,
$E_4 = 0.3$ V,
wherein $E_1$ and $E_2$ in equation (2) represent voltage generated mainly by charging current, and $E_3$ and $E_4$ represent the potential which is divided across resistor R28 and diode D9.

Furthermore, the value of resistor R30 is chosen to be several times that of resistor R31. Diode D10, which is a silicon diode, has a typical forward voltage $V_f$ of about 0.9 V, which voltage is divided by resistors R29 and R30 at a dividing ratio chosen to be about 1:2.

Diodes D7 and D8 are silicon diodes and have forward voltage $V_f$ of about 0.6 V. Diode D10 can have a reference voltage in the range of about 10–50 V (an even greater range may be preferred), and prevents transmission of ripple voltage through resistor R28 to the output at point E.

Accordingly, the value of current of a limited charge depends mainly on a lowered voltage value of resistor R30 when an input voltage overcurrent is present at point C, i.e. upon input of an extremely high initial current.

Under such conditions, the current value of limited charge is able to be maintained at a relatively stable and precise value, which is satisfactorily maintained even under extreme values of input voltage. When the voltage at point C on the input side of the ripple-removing filter circuit 4 is extremely increased, it is operated at a normal level by discharging in a short time. Therefore, a rapid start of electronic appliances can be effected and the output is not affected by ripple voltage at the front end.

Figure 4:
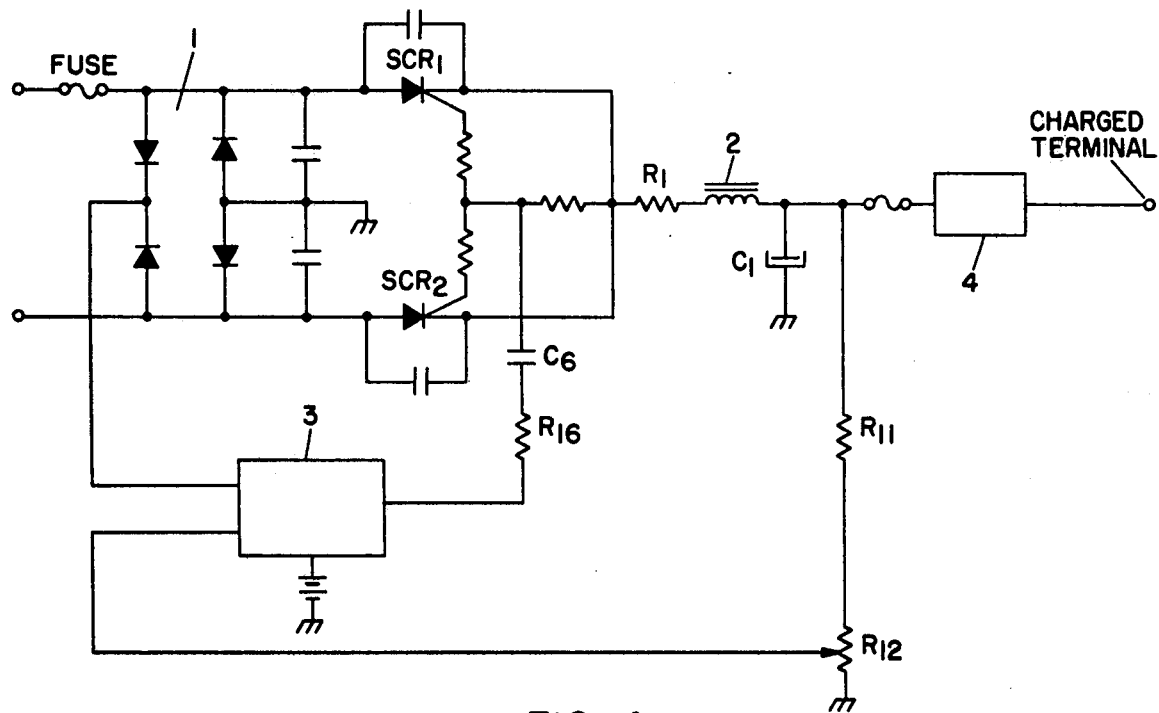
FIG. 4 is an electrical schematic of another embodiment of the present invention.

FIG. 4 shows an alternative SCR arrangement designed to rectify an alternating current, wherein two SCRs are employed, and are placed before the resistor R1 and coil 2. The other parts of the circuit of FIG. 4 are explained above.

As described above, the present invention provides a virtually perfect signal of direct current, where a given stable ripple content is no more than about 0.05 percent. This DC output is obtained by completely removing virtually all ripple through a ripple-removing filter circuit. This is accomplished without a step-down transformer or select switch on the input terminal of alternating input current. Also, the present invention has the advantage that a given constant voltage of DC electrical source is steadily and successfully obtained under AC input voltages ranging from 85 V–260 V, all without the need for adjusting and switching devices.

As shown in Table 1 as a reference, even in areas where the electric source has different voltage values, the circuit of this invention is very effective. Because parts such as step-down transformers are not used, the loss of electrical power in the circuit itself is low and the output power of the AC input, resulting in a relatively high efficiency.

TABLE 1

| COUNTRY | USUAL VOLTAGE (V) | FREQUENCY (Hz) |
|---|---|---|
| Algeria | 127/220 | 50 |
| Australia | 240/250 | 50 |
| Bahrain | 230 | 50 |
| Bangladesh | 220/230 | 50 |
| Bolivia | 110/115/220/230 | 50/60 |
| Brazil | 110/121/220 | 50/60 |
| Taiwan | 220 | 50 |
| Colombia | 110/115/120/130 | 60 |
| France | 115/127/220/230 | 50 |
| Guatemala | 110/120/127/220 | 60 |
| Hawaii | 115 | 60 |
| Hong Kong | 200 | 50 |
| Italy | 127/160/220 | 50 |
| Japan | 100 | 50/60 |
| Kuwait | 240 | 50 |
| Mexico | 110/120/125/127 | 50/60 |
| U.S.A. | 117 | 60 |

From the foregoing, it will be observed that numerous variations and modifications may be effected without departing from the true spirit and scope of the novel concept of the invention. It is to be understood that no limitation with respect to the specific embodiments illustrated herein is intended or should be inferred. It is, of course, intended to cover by the appended claims all such modifications as fall within the scope of the claims.

I claim:

1. An AC to DC converter circuit for use with AC supply signals of various voltages, comprising:
    a rectifying circuit which produces rectified current at its output when connected directly to a source of alternating current having any voltage within a broad range;
    a phase-controlling element connected to the output of the rectifying circuit for controlling the phase of the rectified current signal;
    a trigger signal-generating circuit for generating a trigger signal for regulating the operation of the phase-controlling element;
    a ripple-removing filter circuit connected to the output of said phase-controlling element for removing the ripple component of the DC signal and for providing a relatively constant and substantially ripple-free output signal at an output terminal for energizing an electrical appliance, comprising: a first resistor and first capacitor connected in series between the input of the ripple-removing circuit and ground; at least two transistors arranged in Darlington configuration having their collectors connected to the input of the ripple-removing circuit, the base input of the first Darlington transistor connected to the junction point of the first resistor and first capacitor through a first diode, and the emitter output of the last Darlington transistor connected to the output of the filter circuit, said filter circuit also having rapid start-up means for conducting the Darlington configuration transistors more quickly relative to the time constant of the first resistor and first capacitor, said rapid start-up means comprising a second resistor and second capacitor connected in parallel with, and having a time constant shorter than, the first resistor and first capacitor; and a second diode connected between the base input of the first Darlington transistor and the junction point of the second resistor and second capacitor, said second diode having a smaller forward voltage value than said first diode.

2. The circuit according to claim 1 wherein the ripple-removing filter circuit further includes:
    regulating means comprising a regulating transistor having its collector connected to the junction of the first resistor and first capacitor and to the emitter of the last Darlington transistor configuration through a diode, said regulating transistor conducting to shunt current when the potential at the emitter of the Darlington configuration is above a predetermined value; and
    current limiting means to limit output current comprising: a pair of voltage dividing resistors connected in series between the emitter of the last Darlington transistor emitter output configuration and the filter circuit output, the junction of the voltage dividing resistors being connected to the base of the regulating transistor through a parallel combination of a resistor and diode, a series resistor and series diode, with the junction of the series resistor and series diode connected to the input of the ripple-removing filter circuit through a Zener reference diode and resistor, whereby the regulating transistor conducts to limit current during an initial start-up condition.

3. An AC to DC converter circuit for use with AC supply signals of various voltages, comprising:
    a rectifying circuit which produces rectified current at its output when connected directly to a source of alternating current having any voltage within a broad range;

a phase-controlling element connected to the output of the rectifying circuit for controlling the phase of the rectified current signal;

a trigger signal-generating circuit for generating a trigger signal for regulating the operation of the phase-controlling element; and a ripple-removing filter circuit connected to the output of said phase-controlling element for removing the ripple component of the DC signal and for providing a relatively constant and substantially ripple-free output signal at an output terminal for energizing an electrical appliance, said ripple removing filter circuit comprising: a resistor and capacitor connected in series between the input of the ripple-removing circuit and ground, at least two transistors arranged in Darlington configuration having their collectors connected to the input of the ripple-removing circuit, wherein the base input of the first Darlington transistor connected to the junction of the resistor and capacitor, and wherein the emitter output of the last Darlington transistor connected to the output of the filter circuit; regulating means comprising a regulating transistor having its collector connected to the junction of the resistor and capacitor and to the emitter of the last Darlington transistor configuration through a diode, said regulating transistor conducting to shunt current when the potential at the emitter of the Darlington configuration is above a predetermined value; and current limiting means to limit output current comprising: a pair of voltage dividing resistors connected in series between the emitter of the last Darlington transistor emitter output configuration and the filter circuit output, the junction of the voltage dividing resistors being connected to the base of the regulating transistor through a parallel combination of a resistor and diode, a series resistor and series diode connected to the input of the ripple-removing filter circuit through a Zener reference diode and resistor, whereby the regulating transistor conducts to limit current during an initial start-up condition.

* * * * *